United States Patent
Fang

(10) Patent No.: US 6,924,557 B2
(45) Date of Patent: Aug. 2, 2005

(54) SEMICONDUCTOR PACKAGE

(75) Inventor: Jen-Kuang Fang, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/327,800

(22) Filed: Dec. 23, 2002

(65) Prior Publication Data
US 2003/0127748 A1 Jul. 10, 2003

(30) Foreign Application Priority Data
Jan. 9, 2002 (TW) .................................. 91100187 A

(51) Int. Cl.[7] .............................................. H01L 29/40
(52) U.S. Cl. .................................... 257/778; 257/668
(58) Field of Search ................................ 257/778, 668, 257/676, 779, 690, 735, 782, 787, 723, 724, 686, 685

(56) References Cited

U.S. PATENT DOCUMENTS

| | | | | |
|---|---|---|---|---|
| 5,273,938 A | * | 12/1993 | Lin et al. | 438/107 |
| 5,512,765 A | * | 4/1996 | Gaverick | 257/202 |
| 5,789,278 A | * | 8/1998 | Akram et al. | 438/118 |
| 5,898,223 A | * | 4/1999 | Frye et al. | 257/777 |
| 5,903,058 A | * | 5/1999 | Akram | 257/778 |
| 5,938,856 A | * | 8/1999 | Sachdev et al. | 134/1.3 |
| 6,228,548 B1 | * | 5/2001 | King et al. | 438/106 |
| 6,238,949 B1 | * | 5/2001 | Nguyen et al. | 438/106 |
| 6,262,362 B1 | * | 7/2001 | Czjakowski et al. | 174/35 R |
| 6,329,709 B1 | * | 12/2001 | Moden et al. | 257/690 |
| 6,376,917 B1 | * | 4/2002 | Takeshita et al. | 257/778 |
| 6,492,714 B1 | * | 12/2002 | Kasatani | 257/678 |
| 6,537,482 B1 | * | 3/2003 | Farnworth | 264/482 |
| 6,624,505 B2 | * | 9/2003 | Badehi | 257/678 |
| 2002/0163069 A1 | * | 11/2002 | Lu et al. | 257/690 |

* cited by examiner

Primary Examiner—David Nelms
Assistant Examiner—Thinh T Nguyen
(74) Attorney, Agent, or Firm—Seyfarth Shaw LLP

(57) ABSTRACT

The present invention discloses a semiconductor package, wherein several chips can be packed thereinto. The present invention uses under bump metallurgies or bonding wires to connect the associated circuits of at least two chips in serial or in parallel. At least one slicing path is located between the at least two chips and a substrate is provided with an upper surface and a lower surface in which the upper surface is flip-chip bonded with the at least two chips.

6 Claims, 3 Drawing Sheets

US 6,924,557 B2

SEMICONDUCTOR PACKAGE

BACKGROUND OF THE INVENTION

1. Field of the Invention

The present invention relates to a semiconductor package, more specifically, to a semiconductor package integrating multiple memory chips in an independent encapsulant.

2. Background of the Invention

For the rapidly increasing processing speed of the central processing unit (CPU), the capacity of the memory chips required is becoming relatively higher and higher, of which the speed quadrupling every two or three years. From the past 4 MB DRAM to the current 256 MB DRAM in mass production, the memory chip plays an indispensable role in the whole computer architecture. In order to produce a memory chip with higher capacity, the wafer FAB is required to continuously improve the processing ability and to purchase production equipments of higher cost and precision.

FIG. 1 is a conventional JEDEC (Joint Electronic Device Engineering Council) TSOP54 (Thin Small Outline Package 54 pins) stacking memory chip package 10. The stacking package 10 is to overlap the encapsulant of the individual TSOP54 package 11 up-and-down, and be bonded together, so as to obtain a multiple of memory chip capacity in the same occupied areas. The leadframes 13 of the TSOP54 package 11 are bonded together with the integrated pins 14 for surface mounting, wherein the integrated pins 14 are used to electrically connect the individual leadframes 13. Finally, the integrated pins 14 are responsible for transmitting and receiving the electrical signals from the external system. Each of the encapsulants 12 is provided with a memory chip 15 therein, and electrically connected with the leadframes 13 inside the encapsulant by the metal bonding wires 16.

As described, it is known that the conventional technique has several problems as follows:

(1) Every memory chip 15 needs to be independently packaged, and then stacked and bonded together. Therefore, there are more processing steps overall and longer time is needed. Also, the cost of the packaging material for the overall usage adds up to the cost of the manufacturing material of each package.

(2) Because the encapsulant is stacked and bonded in vertical direction, it can only save the occupied planar footprint, but the total thickness is too big to be applied in a device with narrow space, such as a notebook computer.

(3) The electrical signals are connected to each TSOP 54 package 11 through external integrated pins, so that the signal transmission path is longer and the resistance for the path is larger, which is disadvantageous to high-speed transmission and data access.

SUMMARY OF THE INVENTION

The main object of the present invention is to provide a package for multi-chip module with high capacity, which is to integrate multiple memory chips with the same package for improving the memory chip capacity in multiples for a single package.

The second object of the present invention is to provide a packaging structure preferred for a high-speed data transmission and reception, which can reduce the undesirable circuit effect from the stray capacitance and signal delay.

To this end, the present invention discloses a semiconductor package, which uses the under bump metallurgies to connect the associated circuits of at least two chips in serial or in parallel. Further, it discloses using the metal bonding wires to electrically connect the extensions of different under bump metallurgies to achieve the same purpose for electrical connection. The at least two chips are connected with the substrate in flip-chip bonding manner.

The semiconductor package according to the present invention comprises a chip assembly and a substrate. The chip assembly comprises at least two chips and at least one slicing path. The at least two chips use the connection circuits for electrically connecting with each other. The at least one slicing path is located between the at least two chips. The substrate is provided with an upper surface and a lower surface, in which the upper surface is flip-chip bonded with the chip assembly.

BRIEF DESCRIPTION OF THE DRAWINGS

The invention will be described according to the appended drawings, in which.

DESCRIPTION OF PREFERRED EMBODIMENTS

Figure 1:
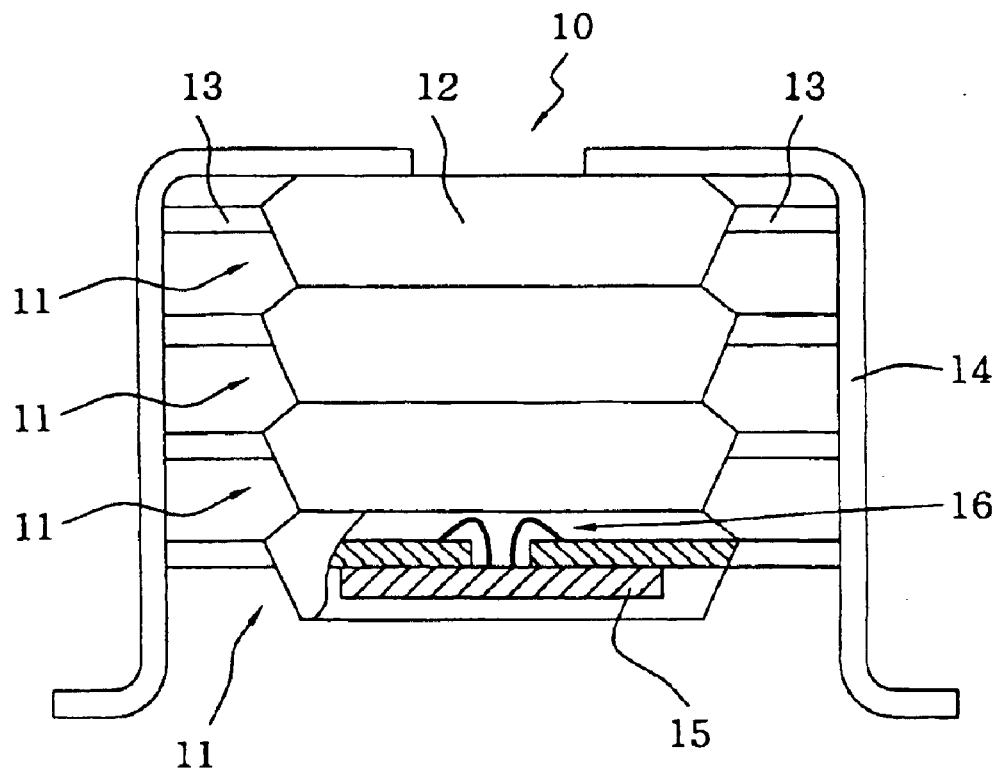
FIG. 1 shows a schematic diagram of a prior JEDEC TSOP 54 stacking memory chip package.
Figure 2:
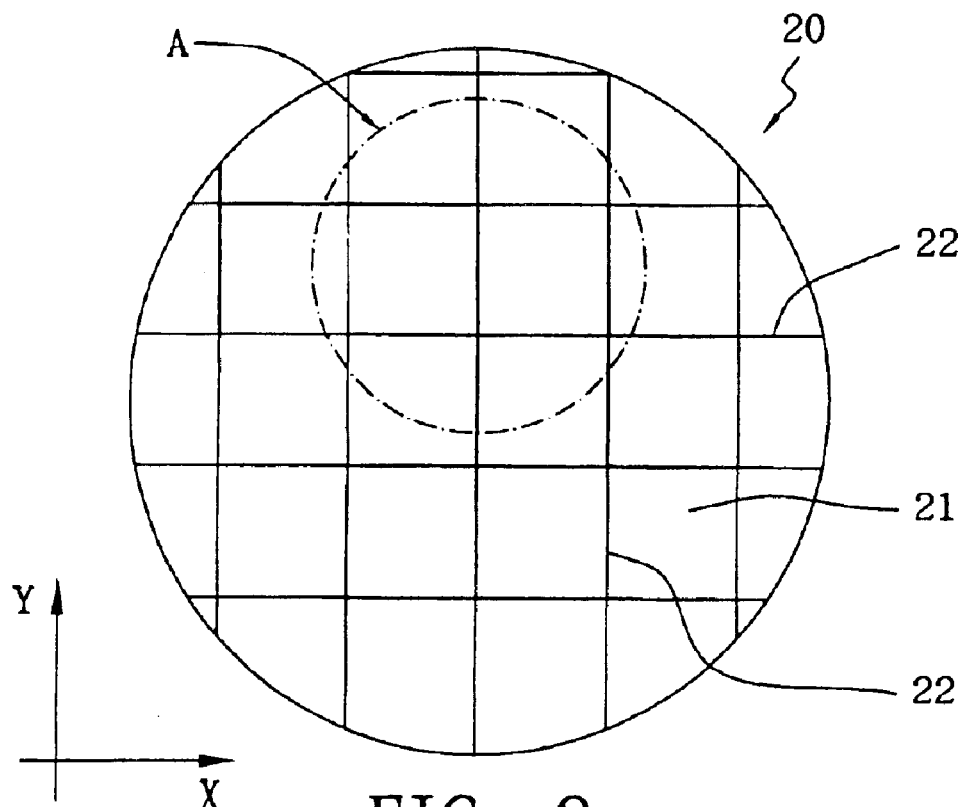
FIG. 2 shows a schematic diagram of a wafer.

FIG. 2 shows a schematic diagram of a wafer according to the present invention. The wafer 20 is provided with a plurality of memory chips 21 and a plurality of slicing paths 22 for separating the memory chips 21, wherein the memory chips 21 are provided with a plurality of bumps and particular circuits (not shown). The conventional technique is required to divide each memory chip 21 along the slicing path 22 as an independent application unit, and the present invention can make a plurality of un-divided memory chips 21 the application unit. For example, the moving pitch of the slicing machine can be configured according to the circuit design manner, as shown in FIG. 2, which requires to be configured to that each movement in the X direction is equal to the width of two memory chips 21, and each movement in the Y direction is equal to the width of one memory chip 21.

Figure 3:
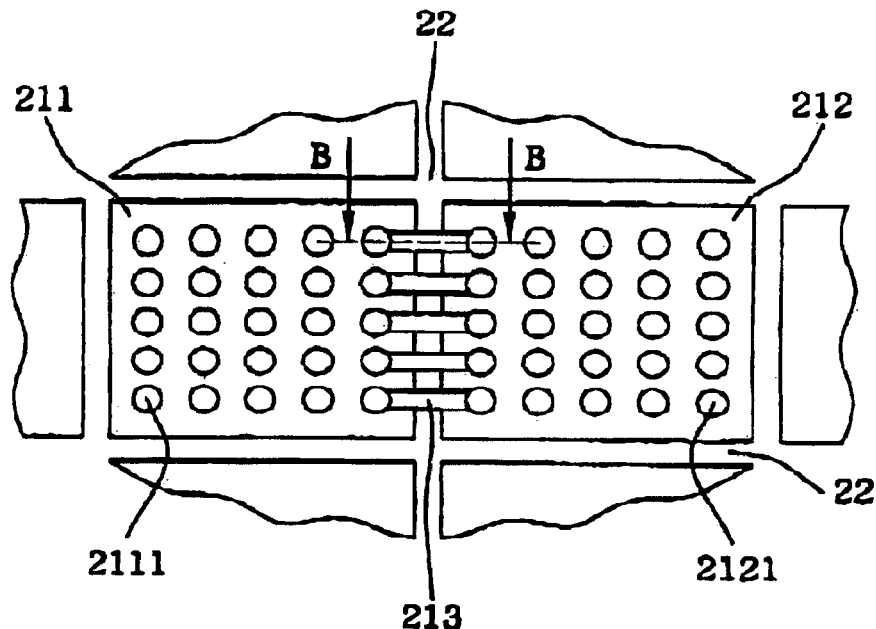
FIG. 3 shows an enlarged diagram of "A" portion in FIG. 2 according to the invention.
Figure 4:
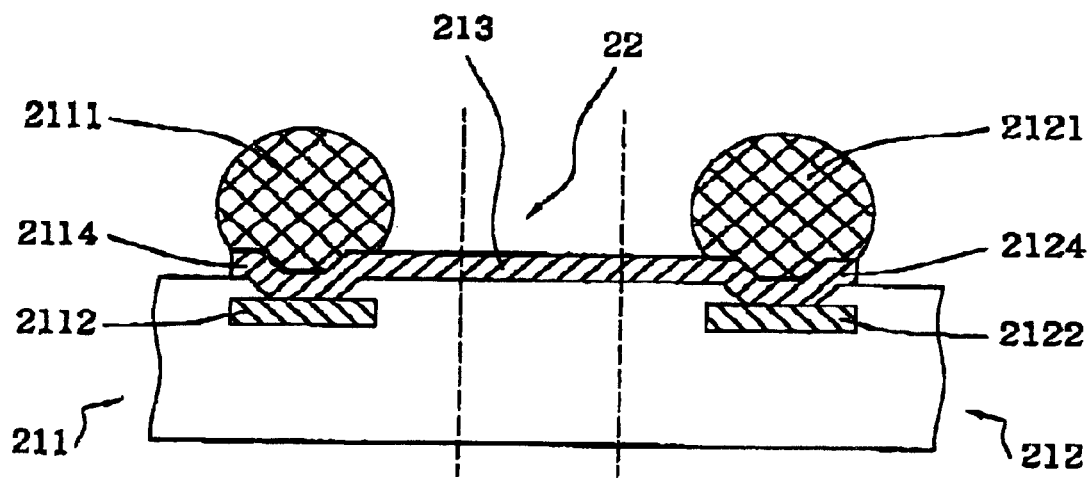
FIG. 4 shows an enlarged cross-sectional diagram along a BB sectional line in FIG. 3.

FIG. 3 shows an enlarged diagram of the "A" portion of FIG. 2 in a preferred embodiment of the present invention. The two adjacent first chip 211 and second chip 212 are provided with a plurality of bumps 2111 and 2121, respectively, in which the under bump metallurgies at the lower portion of the bumps on the adjacent edge are extended outward and connected with each other as a connection portion 213. The connection portion 213 is used to connect the electrical signals from associated buses in serial or in parallel. For example, the address bus and the control bus are processed in parallel, but the data buses remain independent. FIG. 4 illustrates an enlarged cross-sectional diagram along the BB sectional line in FIG. 3. It is clear in the figure that the bump 2111 is provided with the under bump metallurgy 2114 and the pad 2112 underneath, and further the bump 2121 is also provided with the under bump metallurgy 2124 and the pad 2122. A connection portion 213 of an under bump metallurgy in the middle crosses the slicing path 22. When the first chip 211 and the second chip 212 are selected as application units, the slicing path 22 will not be sliced. On the contrary, they can be sliced to form two independent memory chips for respective applications.

Figure 5:
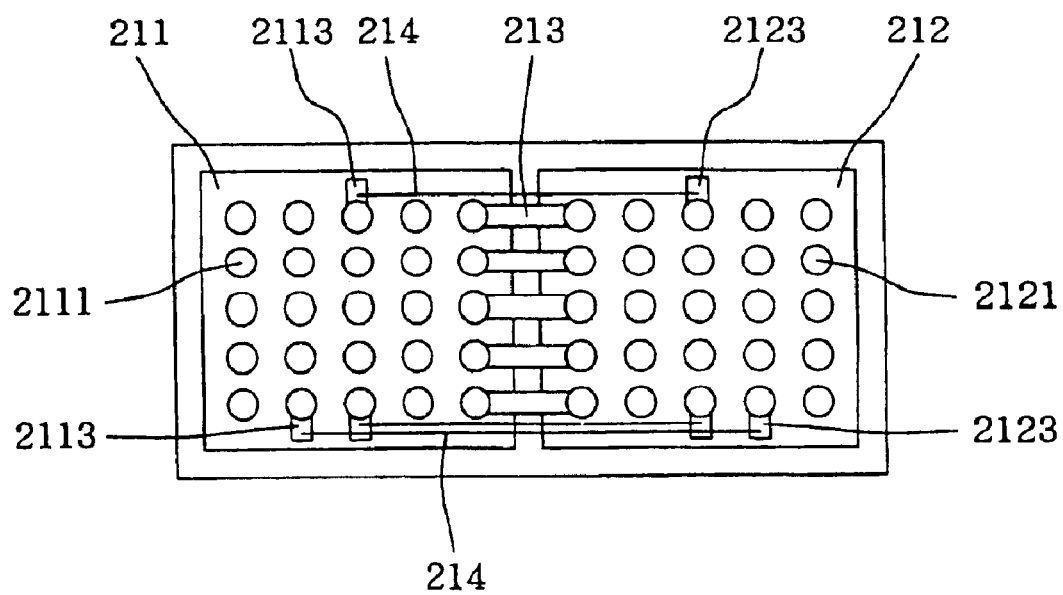
FIG. 5 shows another enlarged diagram of "A" portion in FIG. 2 according to the invention.

FIG. 5 illustrates an enlarged diagram of the "A" portion in FIG. 2 according to another preferred embodiment of the present invention. Because the I/O redistribution process during forming the bumps needs to re-arrange the original positions for the connection pads, the process sometimes cannot effectively put I/Os intended to be connected together as the previous embodiment due to the limitation of circuit density and path arrangement. The under bump metallurgies can be formed extended portions 2113 and 2123 toward the outside of the bumps and using a wire-bonding technique to connect the metal bonding wires 214 with the extended portions 2113 and 2123, so as to obtain the electrical connection between circuits or I/Os in a longer distance.

Figure 6:
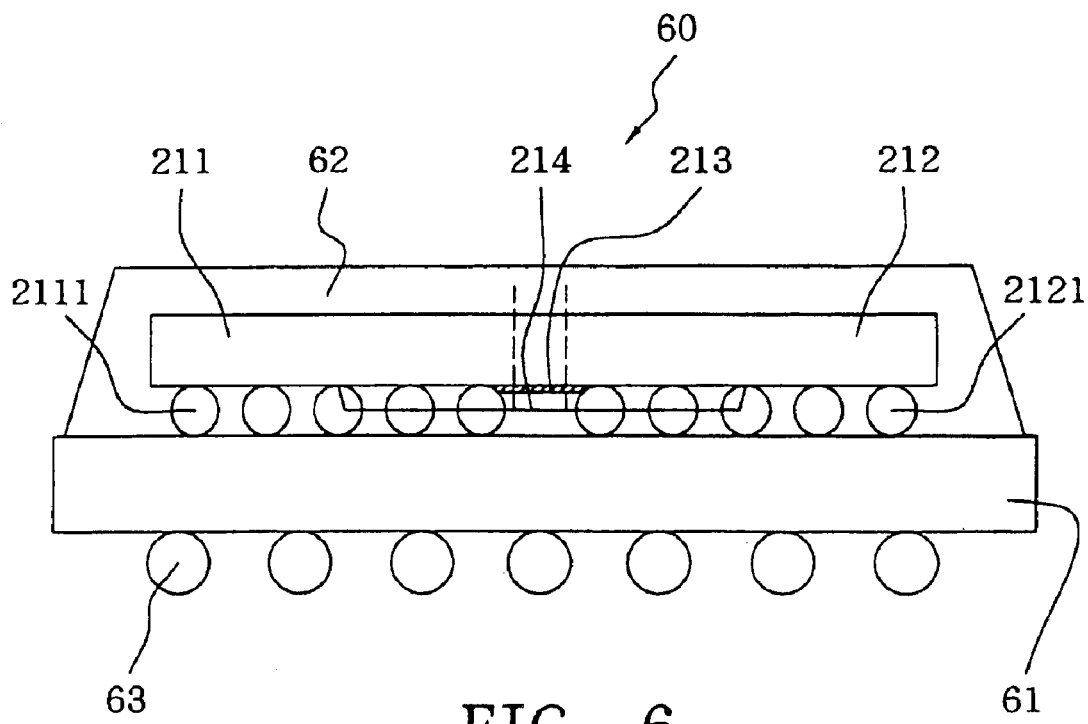
FIG. 6 shows a cross-sectional diagram of the semiconductor package according to the invention.

FIG. 6 shows a cross-sectional diagram of the package 60 according to the present invention. The first chip 211 and second chip 212 electrically connected and undivided are flip-chip bonded with the upper surface of a substrate 61, and further with a pressing encapsulant 62 enclosing above the substrate 61 and the two chips. An underfill is disposed in an interior space between the substrate and the two chips. The lower surface of the substrate 61 is provided with a plurality of solder balls 63, which serve as the electrical contacts and fixed welding points for the package 60 with an external system.

The number of chips in electrical connection according to present invention is not limited to two chips. For example, four adjacent chips can also be electrically connected in the same manner, and the four undivided chips are flip-chip bonded together on a substrate. The connection portion and the extended portion of the under bump metallurgies for electrical connection are reserved with the photoresist agent when processing the under bump metallurgies, so the portion of the metal layer covered with the photoresist agent will not erode during the etching process.

The above-described embodiments of the present invention are intended to be illustrated only. Numerous alternative embodiments may be devised by persons skilled in the art without departing from the scope of the following claims.

What is claimed is:

1. A semiconductor package, comprising:
   a chip assembly including:
   at least two chips, each having an under bump metallurgy, wherein each under bump metallurgy has an extended portion that is electrically connected to the extended portion of the other under bump metallurgy; and
   at least one slicing path located between said at least two chips; and
   a substrate including an upper surface and a lower surface, wherein said upper surface is flip-chip bonded with said chip assembly.

2. The semiconductor package of claim 1, further comprising an encapsulate for covering said upper surface of said substrate and said chip assembly.

3. The semiconductor package of claim 1, further comprising a plurality of solder balls on said lower surface of said substrate.

4. The semiconductor package of claim 1, further comprising an underfill disposed in an interior space between said substrate and said at least two chips.

5. The semiconductor package of claim 1, further comprising metal bonding wires for electrically connecting the extended portions of under bump metallurgies of said at least two chips.

6. The semiconductor package of claim 1, wherein the extended portions of under bump metallurgies are connected to each other directly.

* * * * *